United States Patent
Özer et al.

(10) Patent No.: US 8,826,097 B2
(45) Date of Patent: Sep. 2, 2014

(54) MEMORY SCRUBBING

(75) Inventors: Emre Özer, Cambridge (GB); Sachin Satish Idgunji, San Jose, CA (US)

(73) Assignee: ARM Limited, Cambridge (GB)

( * ) Notice: Subject to any disclaimer, the term of this patent is extended or adjusted under 35 U.S.C. 154(b) by 165 days.

(21) Appl. No.: 13/064,554

(22) Filed: Mar. 30, 2011

(65) Prior Publication Data

US 2012/0254698 A1    Oct. 4, 2012

(51) Int. Cl.
*G11C 29/00* (2006.01)
*G06F 11/10* (2006.01)
*H03M 13/05* (2006.01)

(52) U.S. Cl.
CPC ......... *G06F 11/106* (2013.01); *H03M 13/05* (2013.01)
USPC ............................... 714/763; 714/747

(58) Field of Classification Search
CPC .......... G06F 11/106; G06F 11/1008; G06F 11/1068; G06F 11/1076; G06F 11/1088
USPC .................................. 714/747, 763
See application file for complete search history.

(56) References Cited

U.S. PATENT DOCUMENTS

| 2009/0044086 | A1 | 2/2009 | Craske et al. | |
| 2009/0307523 | A1* | 12/2009 | Allison et al. | 714/6 |
| 2010/0023827 | A1* | 1/2010 | Suzuki et al. | 714/747 |

OTHER PUBLICATIONS

Brown et al., "Radiation Hardened PowerPC 603E Based Single Board Computer", *IEEE*, 2001, pp. 8.C.1-1—8.C.1-12.
Abts et al., "Architectural Support for Mitigating DRAM Soft Errors in Large-Scale Supercomputers", Cray Inc., No Date, 5 pages.
Intel Itanium, A Technical Overview for IT-Decision Makers, Intel, No Date, TOC + pp. 3-15.
Soft Memory Errors and Their Effect on Sun Fire Systems, Sun Microsystems, Apr. 2002, pp. 1-8.
Rodriguez et al., "Challenges in Calculating the WCET of a Complex On-board Satellite Application", No Date, 5 pages.
Mitchell et al., IBM Power5 Processor-based Servers, *IBM*, Oct. 2005, pp. 1-44.
Advanced memory protection for HP ProLiant 300 series G4 servers, *HP*, 2004, pp. 1-11.
UltraSPARC Architecture 2007, *Sun Microsystems*, Jun 2008, TOC + pp. 1-703.

* cited by examiner

*Primary Examiner* — Sam Rizk
(74) *Attorney, Agent, or Firm* — Nixon & Vanderhye P.C.

(57) ABSTRACT

A data processing apparatus is provided which comprises a processor unit configured to perform data processing operations in response to a sequence of instructions and a storage unit configured to store data values for access by the processor unit when performing its data processing operations. Redundant error control data is stored in association with the data values, the redundant error control data enabling identification of an error in the data values. The data processing apparatus also comprises a data scrubbing unit configured to perform a data scrubbing process on at least a subset of the data values, the data scrubbing process comprising determining with reference to the redundant error control data if an error is present in that subset of data values and, where possible, correcting that error with reference to the redundant error control data. The data scrubbing unit is configured to receive a scrub transaction issued within said data processing apparatus, and to perform the data scrubbing process upon receipt of the scrub transaction.

36 Claims, 7 Drawing Sheets

EXAMPLE INSTRUCTION SEMANTICS

| | |
|---|---|
| SCRUB | <SCRUB THE WHOLE MEMORY> |
| SCRUB mem_address | <SCRUB THE MEMORY STARTING FROM mem_address> |
| SCRUB mem_address, range | <SCRUB THE MEMORY PORTION STARTING FROM mem_address TO mem_address + range> |
| SCRUB mem_address: RET | <SCRUB MEMORY AT mem_address AND RETURN UNCORRECTED VALUE IF DATA HAS AN ERROR> |
| SCRUB mem_address, range: RET | <SCRUB THE MEMORY IN THE SPECIFIED RANGE AND RETURN ALL UNCORRECTED VALUES WHERE ERRORS FOUND> |

FIG. 7

MEMORY SCRUBBING

BACKGROUND OF THE INVENTION

1. Field of the Invention

The present invention relates to techniques for maintaining the validity of data stored in memory. More particularly, this invention relates to scrubbing techniques for correcting errors in data stored in memory with reference to redundant information stored in association with that data.

2. Description of the Prior Art

It is known that data stored in a memory device can develop errors. Contemporary memory devices, being constructed at ever smaller scales and higher densities, can be particularly vulnerable to such errors occurring, for example due to variations in the physical structure of the semiconductors from which such devices are constructed, or for example due to an external influence such as temperature variation or incident ionizing radiation. Due to this vulnerability, it is known for error correcting codes (ECC) to be stored in association with the stored data values, to provide a level of redundancy which allows isolated errors (typically single bit errors) to be corrected.

A data processing system may be arranged to check its memory reads for ECC errors, but due to data locality reasons a sequence of memory reads can be confined to a small range of addresses leaving other memory locations untouched for a long time. The longer a memory location is left untouched, the more vulnerable it can become to more than one soft (i.e. correctable) error occurring.

In view of the recognised problem that memory locations which are left untouched for a long time may develop errors which cannot be corrected with reference to the ECC data, it is known to perform memory scrubbing. Typically, this technique involves the memory controller periodically reading in memory lines, checking for and correcting any errors, and subsequently writing those memory lines back. Assuming that this memory scrubbing can be performed frequently enough that single bit flip errors do not accumulate into multiple bit errors, then this technique can maintain the validity of the data in the memory device.

Automatic memory scrubbing is used in various fields where data reliability is important, such as embedded processors used in safety-critical systems, and in environments which are exposed to radiation levels which increase the frequency of bit flip errors, such as space/error space applications (see for example M. Rodriguez, N. Silva, J. Esteves, L. Henriques, D. Costa, N. Holsti, K. Hjortnaes, "Challenges in Calculating the WCET of a Complex On-board Satellite Application", In Proc. 3rd International Workshop on Worst-Case Execution Time Analysis, (WCET 2003), 2003). The technique is also used in data servers to promote reliability, availability and serviceability (RAS).

In order not to disturb regular memory requests and the consequent performance impact, memory scrubbing is usually performed during idle periods of the data processing system, being performed periodically rather than continuously. This automated process is usually controlled by the memory controller which initiates an automatic memory scrubbing process. Examples of such automated memory scrubbing processes are discussed in:

"The Intel Itanium Processor 9300 Series", White Paper, retrieved from http://download.intel.com/products/processor/itanium/323247.pdf;

D. Abts, J. Thompson and G. Schwoerer, "Architectural Support for Mitigating DRAM Soft Errors in Large-Scale Supercomputers", Selse 3, 2007;

J. Mitchell, D. Henderson and G. Ahrens, "IBM POWER5 Processor-based Servers: A Highly Available Design for Business-Critical Applications", 2006; and Advanced Memory Protection for HP ProLiant 300 Series G4 Servers", http://h20000.www2.hp.com/bc/docs/support/SupportManual/c00218059/c00218059.pdf.

Some servers such as the Sun Solaris servers perform memory scrubbing by running a kernel memory scrub thread (see "Soft Memory Errors and Their Effect on Sun Fire™ SystemsE, Sun Microsystems, 2002). This thread scrubs the whole memory periodically and the scrub process is set up so that it will traverse all of the physical memory within 12 hours. Furthermore it reads 8 MB pages so as not to be obtrusive. The read operation is accomplished using block load hardware to maximize read bandwidth (see UltraSPARC Architecture 2007, http://opensparc-t2.sunsource.net/specs/UA2007-current-draft-HP-EXT.pdf).

G. R. Brown, "Radiation Hardened PowerPC 603e TM Based Single Board Computer", Aerospace Conference, 2001, IEEE Proceedings, 2001 discusses a radiation-hardened embedded processor designed for space and aerospace applications implementing a hardware memory scrubber in the memory controller.

Another known memory scrubbing techniques involves performing memory scrubbing in a cache using the physical location (i.e. set/way) rather than the addresses. To do this a dummy access is made to the cache which is similar to a cache maintenance operation. This technique is discussed in US Published Patent Application 2009/0044086.

However, such automated memory scrubbing techniques must be carefully set up so that they do not adversely affect the system performance, whilst on the other hand they must be sufficiently active to ensure that the data reliability is maintained. In this context it would be desirable to provide an improved technique for memory scrubbing.

SUMMARY OF THE INVENTION

Viewed from a first aspect, the present invention provides a data processing apparatus comprising: a processor unit configured to perform data processing operations in response to a sequence of instructions; a storage unit configured to store data values for access by said processor unit when performing said data processing operations, wherein redundant error control data is stored in association with said data values, said redundant error control data enabling identification of an error in said data values; and a data scrubbing unit configured to perform a data scrubbing process on at least a subset of said data values, said data scrubbing process comprising determining with reference to said redundant error control data if said error is present in said subset of data values and, where possible, correcting said error with reference to said redundant error control data, wherein said data scrubbing unit is configured to receive a scrub transaction issued within said data processing apparatus, and said data scrubbing unit is configured to perform said data scrubbing process upon receipt of said scrub transaction.

Accordingly, within the data processing apparatus, a data scrubbing unit is provided which is configured to perform a data scrubbing process upon receipt of a scrub transaction. It should be noted that "data" and "data values" are used here as generic terms to refer to any values which may be stored in the storage unit and may therefore refer to instructions and/or data.

Firstly, this approach reduces the involvement of the processor unit in the data scrubbing process (other than issuing the scrub transaction or causing another component of the data processing apparatus to issue the scrub transaction). By contrast, in prior art approaches which use the load/store method to enable the memory scrubbing process, data is brought into the processor unit, adversely affecting processor performance and occupying bandwidth. Furthermore, in a multi-processor system, the use of load/store instructions by one processor unit to effect memory scrubbing may generate unnecessary snoop requests in the other processor units, as well as invalidations or updates. The use of a scrub transaction to trigger the data scrubbing process by the data scrubbing unit however does not involve the usual memory access mechanisms, and therefore does not change the state of the cache line or any cache replacement hardware state, and need not generate snoop requests to the other processor units.

Furthermore another benefit of initiating the data scrubbing process via a dedicated scrub transaction is that the scrub transaction can be handled differently to other memory access requests, for example an issued scrub transaction can be dropped if a memory access request to the same area of memory is received.

Further still, providing a mechanism whereby the data scrubbing process is initiated by a scrub transaction issued within the data processing apparatus provides a mechanism by which the scheduling of the data scrubbing process can be integrated into the workload and operating state of the components and the data processing apparatus, in particular the processor unit. Thus, depending on the level of control which is desired, the operating system, compiler or programmer can choose to initiate the data scrubbing process on particular regions of memory. For example even from the high level view of the programmer, particular regions of memory can be targeted for scrubbing (say, before those regions are to be used by subsequent program steps).

In one embodiment said processor unit is configured to issue said scrub transaction to said storage unit in response to a data scrub instruction in said sequence of instructions. Accordingly, a data scrub instruction is provided which will cause the processor unit to issue the scrub instruction to the storage unit. Providing an instruction with this functionality enables a greater degree of control and flexibility in the scheduling of the scrubbing process, which may be particularly beneficial in combination with the knowledge that, say, the programmer has about the operation and performance of the processor unit.

In another embodiment, said processor unit is configured to program a further component of said data processing apparatus to issue said scrub transaction to said storage unit. Accordingly, a further component of the data processing apparatus, for example a DMA, may be programmed by the processor unit to issue the scrub transaction. This programming may comprise setting up the further component to issue a sequence of scrub transactions at predetermined times (or on occurrence of predetermined events), or may simply comprise the processor unit signalling to the further component that it should issue the scrub transaction. The ability to program a further component of the data processing apparatus to issue the scrub transaction further enhances the ability of the system to delegate the management of the data scrubbing process to components other than the processor unit, thus reducing the processing burden on the processor unit.

In one embodiment the data processing apparatus comprises a memory hierarchy, said storage unit forming a level of said memory hierarchy, wherein said data processing apparatus is configured to pass said scrub transaction through sequential levels of said memory hierarchy. The ability to pass the scrub transaction through sequential levels of the memory hierarchy means that the scrub transaction can potentially act at various levels of the memory hierarchy, where a corresponding sequence of data scrubbing units may be provided, in order to efficiently perform data scrubbing on several levels of the memory hierarchy in response to a single issued scrub transaction. The memory hierarchy may of course take a variety of forms, one example being a local (L1) cache associated with the processor unit, a shared (L2) cache and an external memory.

As mentioned above, it is contemplated that the data scrubbing process may be carried out at several levels of the memory hierarchy and accordingly in one embodiment each of said sequential levels of said memory hierarchy has an associated data scrubbing unit and each associated data scrubbing unit is configured to perform said data scrubbing process at its respective level of said memory hierarchy in response to receipt of said scrub transaction.

In one embodiment said data processing apparatus further comprises a memory controller configured to schedule access to said data storage unit, wherein said data scrubbing unit forms part of said memory controller. A memory may have an associated memory controller to administer access requests seeking to access data stored within that memory. The integration of the data scrubbing unit into such a memory controller facilitates the coordination of the data scrubbing process with the normal memory access requests in the data processing apparatus, for example ensuring that normal memory access requests are not hindered by the activities of the data scrubbing process.

In one such embodiment said memory controller is configured to receive said scrub transaction issued to said storage unit, and in response to schedule an access to said storage unit to retrieve said subset of data values to be subjected to said data scrubbing process by said data scrubbing unit. Accordingly, the memory controller can administer the scheduling of the data scrubbing process such that it is coordinated with the scheduling of the normal memory access requests accessing the storage unit.

The use of the redundant error control data to correct errors in data stored in the storage unit may form part of the access procedure to data in the storage unit, for example a correction process with reference to ECC data being performed as part of a read access request scheduled by the memory controller. Hence in one embodiment said access further comprises writing said subset of data values back to said storage unit after said data scrubbing process by said data scrubbing unit, such that the corrected data overwrites the original data in the storage unit.

As mentioned above, an advantage of initiating the data scrubbing process by a scrub transaction is that this scrub transaction may be handled differently to ordinary memory requests, in particular such that ordinary memory requests are not adversely affected by the data scrubbing process, and hence in one embodiment said memory controller is configured to abandon said access to said data storage unit, if a higher priority memory access request is received.

The storage unit may be a cache configured to temporarily store copies of data items which are frequently used by the processor unit, and in one embodiment said data processing apparatus further comprises a cache controller configured to schedule access to said data storage unit, wherein said data scrubbing unit forms part of said cache controller. The integration of the data scrubbing unit into such a cache controller facilitates the coordination of the data scrubbing process with the normal access to the cache, for example ensuring that cache accesses are not hindered by the activities of the data scrubbing process.

In one embodiment said cache controller is configured to receive said scrub transaction issued to said storage unit, and in response to schedule a cache access to said storage unit to retrieve said subset of data values to be subjected to said data scrubbing process by said data scrubbing unit. Accordingly, the cache controller can administer the scheduling of the data scrubbing process such that it is coordinated with the scheduling of the normal cache accesses.

In one embodiment said cache access further comprises writing said subset of data values back to said storage unit after said data scrubbing process by said data scrubbing unit. For example, where a correction process with reference to ECC data stored in association with a cache line may be performed as part of an access to that cache line, the corrected version may be written back to the cache line to correct any errors that are found.

In one embodiment said cache controller is configured to abandon said access to said data storage unit, if a higher priority cache access request is received. This relative prioritization, wherein at least some cache access requests are identified as being of higher priority than the scrub transaction, helps to ensure that the normal access to the cache is not adversely affected by the data scrubbing process.

The data scrub transaction may take a number of forms, but in one embodiment said data scrub transaction specifies at least one data address in said storage unit, said at least one data address identifying said subset of data values. Accordingly, this provides a mechanism by which the data scrubbing process may be targeted towards that at least one data address.

In another embodiment said data scrub transaction further specifies a data address range, said at least one data address and said data address range identifying said subset of data values. Accordingly, an entire data address range may be subjected to the data scrubbing process by the efficient mechanism of the specification of that data address range within the data scrub transaction.

In one embodiment said data scrub transaction further comprises a data return indicator, wherein said data processing apparatus is configured such that, if said error is present in said subset of data values, an error-containing data value in which said error is present is returned to said processor unit. It may be the case that the data scrubbing process should be carried out as purely background process without further interaction with the remainder of the data processing apparatus, but this embodiment allows the processor unit to be informed if an error is found during the data scrubbing process. For example, this may allow the programmer greater visibility of where errors are occurring in the storage unit, which may be useful for diagnostic or system development purposes.

In another embodiment, said data scrub transaction does not specify a data address in said storage unit, and said data scrubbing unit is configured to perform said data scrubbing process on all data values stored in said storage unit upon receipt of said scrub transaction. Accordingly, without further complicating the configuration of the data scrub transaction, the data scrubbing process may be carried out on the entirety of the storage unit by the efficient mechanism of simply not specifying a data address within the data scrub transaction.

Whilst in some embodiments the data processing apparatus may comprise a single processor unit, in other embodiments said data processing apparatus further comprises at least one further processor unit configured to perform said data processing operations in response to said sequence of instructions. The present technique, based on the use of a scrub transaction issued within the data processing apparatus to cause a data scrubbing unit to perform its data scrubbing process, is of particular benefit in multi-core systems (i.e. those having at least two processor units). The complexities associated with administering memory access requests in a multi-core system can lead to undesirable side effects in prior art systems implementing memory scrubbing. For example, the mechanisms that are typically provided to ensure that data coherency is maintained and memory access requests originating from different processor units do not conflict with each other can be triggered by load and/or store operations carried out as part of a memory scrubbing process, causing unnecessary cross-checks and data maintenance operations to be carried out. However, according to the present technique, by providing a scrub transaction to initiate the data scrubbing process, interaction with such mechanisms can be avoided, or at least only triggered when desirable in the context of the data scrubbing process.

In one embodiment said data processing apparatus further comprises a further processor unit; a first local storage unit associated with said processor unit, said first local storage unit configured to store first local copies of said data values for use by said processor unit; a second local storage unit associated with said further processor unit, said second local storage unit configured to store second local copies of said data values for use by said further processor unit, wherein each of said first and second local storage units has a local data scrubbing unit configured to perform said data scrubbing process with respect to said first local copies and said second local copies respectively upon receipt of said scrub transaction. Accordingly each processor unit has its own local storage unit (for example this may be a level one cache) each of which has its own associated data scrubbing unit which can perform the data scrubbing process on the corresponding local copies (e.g. the cache contents for each cache) on receipt of the scrub transaction. As such it will be appreciated that a single scrub transaction may be issued within the data processing apparatus, but may be received and acted upon by more than one data scrubbing unit, even if that data scrubbing unit is not on the direct hierarchical path between a processor unit and external memory (e.g. L1 cache, L2 cache, memory), but also within data scrubbing units provided elsewhere in the data processing apparatus, for example associated with another processor unit (which did not originally issue the scrub transaction).

In such embodiments mechanisms may be provided to ensure data coherency is maintained between such local storage units, and in one embodiment said data processing apparatus comprises a coherency controller, said coherency controller configured to administer a coherency protocol between said first local storage unit and said second local storage unit.

The coherency controller may take a number of forms, but in one embodiment said coherency controller comprises a snoop control unit. Such a snoop control unit is configured to monitor access requests and transactions passing through the data processing apparatus, in order, if necessary, to initiate an action defined by the coherency protocol. The coherency controller may also comprise a cache coherency directory. A cache coherency directory represents a structure which enables the coherency controller to maintain an overview of the data values which are locally cached in different parts of the data processing apparatus, in order to administer the coherency protocol.

The data scrubbing process may be independent of the coherency protocol, but in one embodiment said data processing apparatus comprises a scrub control unit, said scrub control unit configured to control said data scrubbing process in dependence on said coherency protocol. This dependency may take a number of forms.

In one embodiment, said scrub control unit is configured, if said coherency protocol indicates that a local copy of a data value which is subject to said scrub transaction is invalid, to cause said data scrubbing process not to be performed with respect to said local copy and to cause said scrub transaction to be passed to a next level of said memory hierarchy. Accordingly, where the coherency protocol indicates that a data value at a given level of the memory hierarchy is invalid, it is recognised that the data scrubbing process need not be performed with respect to an invalid data value and the scrub transaction is passed to the next level of the memory hierarchy.

In one embodiment said scrub control unit is configured, if said coherency protocol indicates that a local copy of a data value which is subject to said scrub transaction is shared or exclusive, to cause said data scrubbing process to be performed with respect to said local copy and to cause said scrub transaction to be passed to a next level of said memory hierarchy. Accordingly, whether the local copy of the data value is identified as shared or exclusive, it is recognised that the data scrubbing process should not only be performed on this local copy, but should also be passed to the next level of the memory hierarchy.

In one embodiment, said scrub control unit is configured, if said coherency protocol indicates that a local copy of a data value which is subject to said scrub transaction is modified, to cause said data scrubbing process to be performed with respect to said local copy and to cause said scrub transaction not to be passed to a next level of said memory hierarchy. Accordingly, where the local copy of the data value is identified as modified, it is recognised that the data scrubbing process need only be performed with respect to that local copy (since copies of that data value at further levels of the memory hierarchy are yet to be updated with respect to that local copy) and therefore the data scrubbing process is only performed at that level and not passed further through the memory hierarchy.

In one embodiment said coherency controller comprises a cache coherency directory and said scrub control unit is configured, if said cache coherency directory indicates that corresponding to a local copy of a data value which is subject to said scrub transaction there is a further local copy stored in further local storage unit which is modified, to cause said data scrubbing process not to be performed with respect to said local copy and to cause said scrub transaction not to be passed to a next level of said memory hierarchy. Accordingly, if it is identified (with reference to the cache coherency directory) that this data value has been stored as a local copy elsewhere (e.g. cached for another processor unit) and furthermore that other copy is identified as modified, then it is recognised that the data scrubbing process need not be performed either in this level or in any further level of the memory hierarchy.

In one embodiment said scrub control unit is configured to control said snoop control unit to cause said scrub transaction to be passed to said second storage unit when said scrub transaction is received by said first storage unit, and said scrub control unit is configured to control said snoop control unit to cause said scrub transaction to be passed to said first storage unit when said scrub transaction is received by said second storage unit. Thus the scrub control unit can redistribute a scrub transaction received by one storage unit to be acted upon by the other storage unit. This ability to redistribute a scrub transaction in a multi-core system not only enables a unified approach to ensuring the reliability of the data within the system to be provided, but furthermore the necessary actions to support this can be triggered by only a single scrub transaction issued within the data processing apparatus.

The present techniques, and in particular the data reliability which stems therefrom, are of particular benefit when said data processing apparatus is configured to perform said data processing operations in a real-time data processing environment.

The present techniques and consequent data reliability are also of particular benefit wherein said data processing apparatus is configured to perform said data processing operations in a server system.

The present techniques and consequent data reliability are also of particular benefit wherein said data processing apparatus is configured to perform said data processing operations in a fault tolerant system.

As mentioned above, it should be recognised that the data values on which the data scrubbing process is carried out are not limited in terms of what those data values can represent. In one embodiment said subset of said data values comprises instruction data. In another embodiment said subset of said data values comprises data values which are non-instruction data.

In embodiments where the processor unit issues the scrub transaction, the processor unit may comprise a dedicated scrub issue unit configured to issue said scrub transaction to said storage unit. Alternatively or in addition in such embodiments the processor unit may comprise a load/store unit configured to issue said scrub transaction to said storage unit.

Viewed from a second aspect the present invention provides a data processing apparatus comprising: processing means for performing data processing operations in response to a sequence of instructions; storage means for storing data values for access by said processing means when performing said data processing operations, wherein redundant error control data is stored in association with said data values, said redundant error control data enabling identification of an error in said data values; and data scrubbing means for performing a data scrubbing process on at least a subset of said data values, said data scrubbing process comprising determining with reference to said redundant error control data if said error is present in said subset of data values and, where possible, correcting said error with reference to said redundant error control data, wherein said data scrubbing means is configured to receive a scrub transaction issued within said data processing apparatus, and said data scrubbing means is configured to perform said data scrubbing process upon receipt of said scrub transaction.

Viewed from a third aspect the present invention provides a method of data processing in a data processing apparatus comprising the steps of: performing data processing operations in a processor unit in response to a sequence of instructions; storing data values in a storage unit for access when performing said data processing operations, wherein redundant error control data is stored in association with said data values, said redundant error control data enabling identification of an error in said data values; and performing a data scrubbing process on at least a subset of said data values, said data scrubbing process comprising determining with reference to said redundant error control data if said error is present in said subset of data values and, where possible, correcting said error with reference to said redundant error control data, wherein performing said data scrubbing process is carried out upon receipt of a scrub transaction issued within said data processing apparatus.

BRIEF DESCRIPTION OF THE DRAWINGS

The present invention will be described further, by way of example only, with reference to embodiments thereof as illustrated in the accompanying drawings, in which:

FIG. 7 shows example semantics for a data scrub instruction in one embodiment.

DESCRIPTION OF THE PREFERRED EMBODIMENTS

Figure 1:
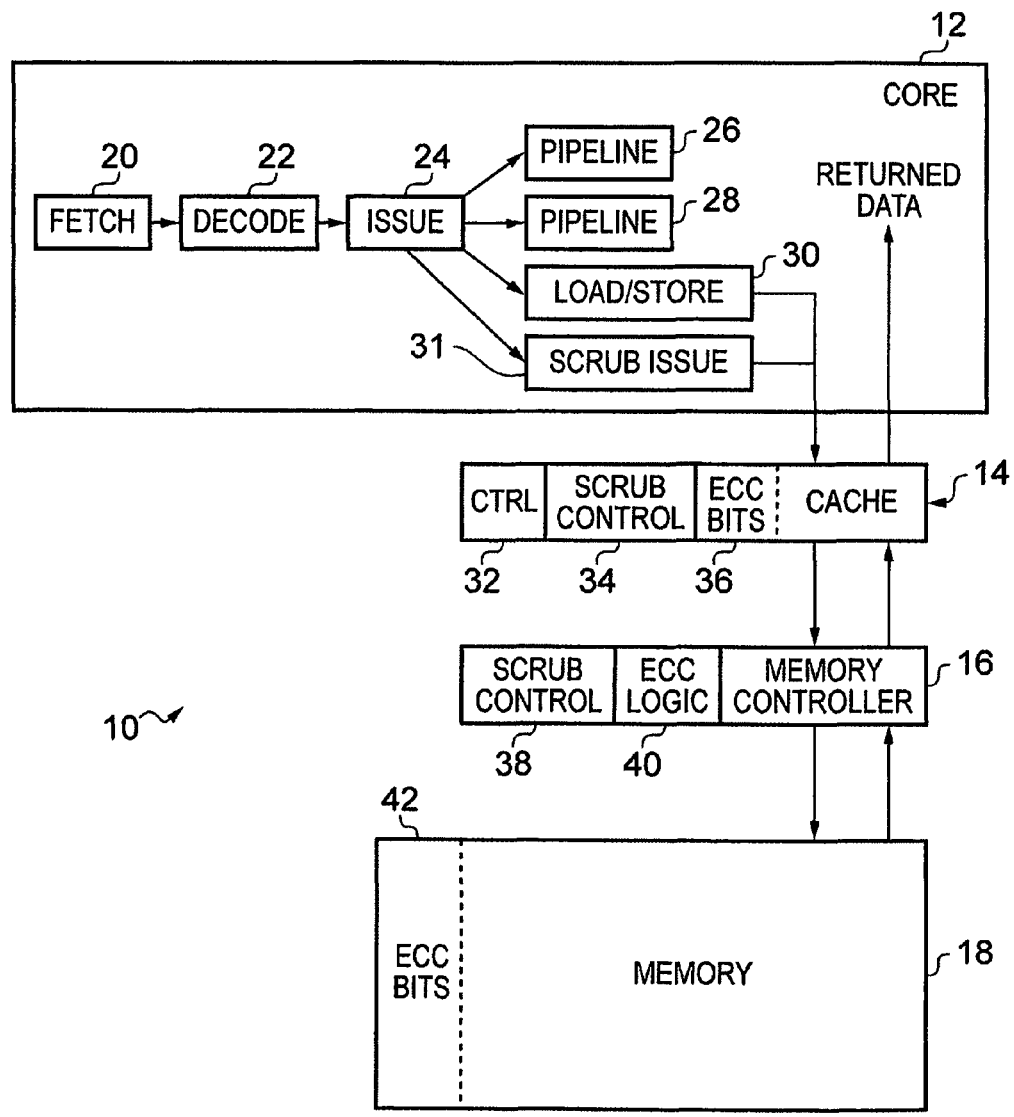
FIG. 1 schematically illustrates a data processing apparatus comprising a single processor unit in one embodiment.

FIG. 1 schematically illustrates a data processing apparatus in one embodiment. The data processing apparatus 10 comprises a processor unit (core) 12, a local cache 14, a memory controller 16 and a memory 18. Together, the cache 14 and memory 18 form a memory hierarchy, wherein an access request for data in memory 18 is first handled by cache 14, and only if cache 14 is unable to complete that memory access request is the access request passed further to memory 18.

It will be understood that processor unit 12 comprises many more components than those schematically illustrated here, which have been omitted for the sake of clarity. Processor unit 12 is configured to perform various data processing operations in response to a sequence of instructions. These instructions are fetched from memory by fetch unit 20, decoded in decode unit 22 before being issued by issue unit 24 to one of the pipelines 26, 28, 30, 31. Amongst the pipelines each may have a dedicated role. In particular the load/store unit 30 is illustrated, which is responsible for issuing access requests to the memory hierarchy. Also, a scrub issue unit 31 is illustrated, which is a dedicated component for issuing scrub transactions from the processor core 12, these scrub transactions being passed into the memory hierarchy in a similar manner to load or store requests issued by load/store unit 30. A memory access request received by cache 14 is administered by cache controller 32 to look up whether the requested data is present in cache 14 and if so to return that data to the processor unit 12. If the requested data is not present in cache 14, then the memory access request is passed further to memory controller 16 which schedules access to the memory 18, from where the data can be returned via cache 14 to the processor unit 12. The data values stored in cache 14 and memory 18 additionally comprise ECC bits 36 and 42 respectively, which provide redundant error control data for correcting single bit errors which may occur in the stored data values. Part of the normal operation for a load operation involves checking these ECC bits to determine if a single bit error has occurred in the data value being accessed, and if so to correct that error. For the memory 18, this is performed by ECC logic 40 with reference to the ECC bits 42. For the cache 14 this is performed under control of the cache controller 32 with reference to the ECC bits 36.

The cache 14 and memory controller 16 each additionally comprise a scrub unit 34, 38. These scrub units are provided to be responsive to a particular kind of transaction which may be passed from the processor unit 12 into the memory hierarchy, namely a scrub transaction. A scrub transaction can be issued by the load/store unit 30, but in the illustrated example the dedicated scrub issue unit 31 is provided for issuing the scrub transactions into the memory hierarchy. In response to receipt of the scrub transaction, each scrub unit is configured to perform a data scrubbing process on data values within its respective level of the memory hierarchy, this data scrubbing process comprising identifying with reference to the respective ECC bits if an error is present in the data values and where possible to correct it. For example, the memory controller 16 can schedule an access to the memory 18 in response to the scrub transaction, this access comprising retrieving one or more data values from the memory, and writing back the values as corrected by the ECC logic 40. Similarly, the cache controller 32 can schedule an access to the cache 14 in response to the scrub transaction, this access comprising retrieving a corresponding cache line, and writing back a cache line corrected with reference to ECC bits 36. Further, the scrub unit 34 is configured to determine whether it is appropriate to pass the transaction from the cache level to the memory level in dependence on the status of the data held in the cache, as will be discussed in more detail in the following.

Figure 2:
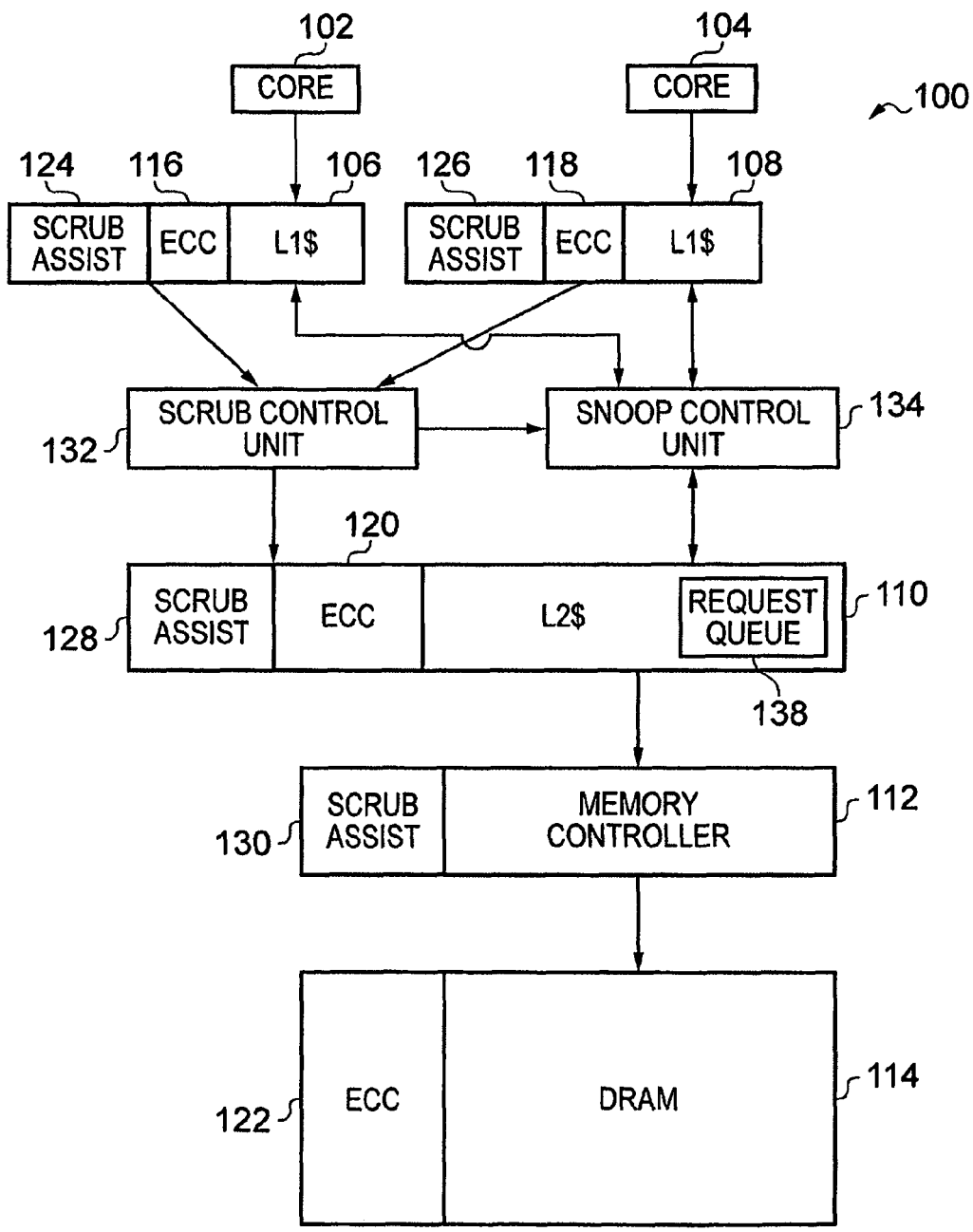
FIG. 2 schematically illustrates a data processing apparatus having two processor units in one embodiment.

FIG. 2 schematically illustrates a multi-core example embodiment. The data processing apparatus 100 comprises two processor cores 102, 104 each of which has an associated local level one (L1) cache 106, 108 respectively. The L1 caches 106, 108 form the first level of a memory hierarchy which further comprises a shared level two (L2) cache 110 and an external memory 114. Accesses to the external memory, which in this example is a DRAM device, is administered by memory controller 112.

The validity of the data values stored at each level of the memory hierarchy may be verified with reference to the ECC data 116, 118, 120, 122 respectively at each level. Whilst this ECC data can be used as part of the usual correction process when data is retrieved from each level of the memory hierarchy by a memory access request, of interest in the context of the present invention is the further use of this ECC data by the data scrubbing unit provided at each level of the memory hierarchy. These hardware "scrub assist" units 124, 126, 128 and 130 are each responsive to receipt of a scrub transaction issued within the data processing apparatus to perform a data scrubbing process, making use of the respective ECC data, on data values within that level of the memory hierarchy.

Additionally, the data processing apparatus 100 further comprises scrub control unit 132 and snoop control unit 134. The scrub control unit 132 acts as a central administrator in the data processing apparatus 100 to ensure that the data scrubbing processes carried out in the data processing apparatus are appropriately carried out. One way that the scrub control unit 132 may do this is in dependence on a data coherency protocol which has been defined for the various data storage units of the data processing apparatus. In order to correctly administer the data coherency protocol, the scrub control unit can control the action of the snoop control unit 134, such that a scrub transaction issued in one part of the data processing apparatus (e.g. initially issued by core 102 to its L1 cache 106) is also appropriately applied in another relevant part of the data processing apparatus (e.g. in cache 108 belonging to core 104). This administration is described in more detail hereinafter.

Note also that the shared L2 cache 110 also has a request queue 138. In general this request queue enables the L2 cache to administer the memory access requests it receives (whether initiated by core 102 or core 104). However the request queue 110 also enables the L2 cache to manage the relative importance of received scrub transactions with respect to the memory access requests. For example, each memory access request may have an associated priority and the L2 cache can be configured to identify a priority level for a scrub transaction. This will typically be low, and may indeed be lower than any memory access request. Hence, if a memory access request is received whilst a scrub transaction is held in the request queue 138, the scrub transaction can be dropped, to allow the memory access request to proceed without being delayed by the data scrubbing process. Note that such a request queue may be provided at any level of the memory hierarchy and only one request queue is shown in FIG. 2 for clarity.

Figure 3:
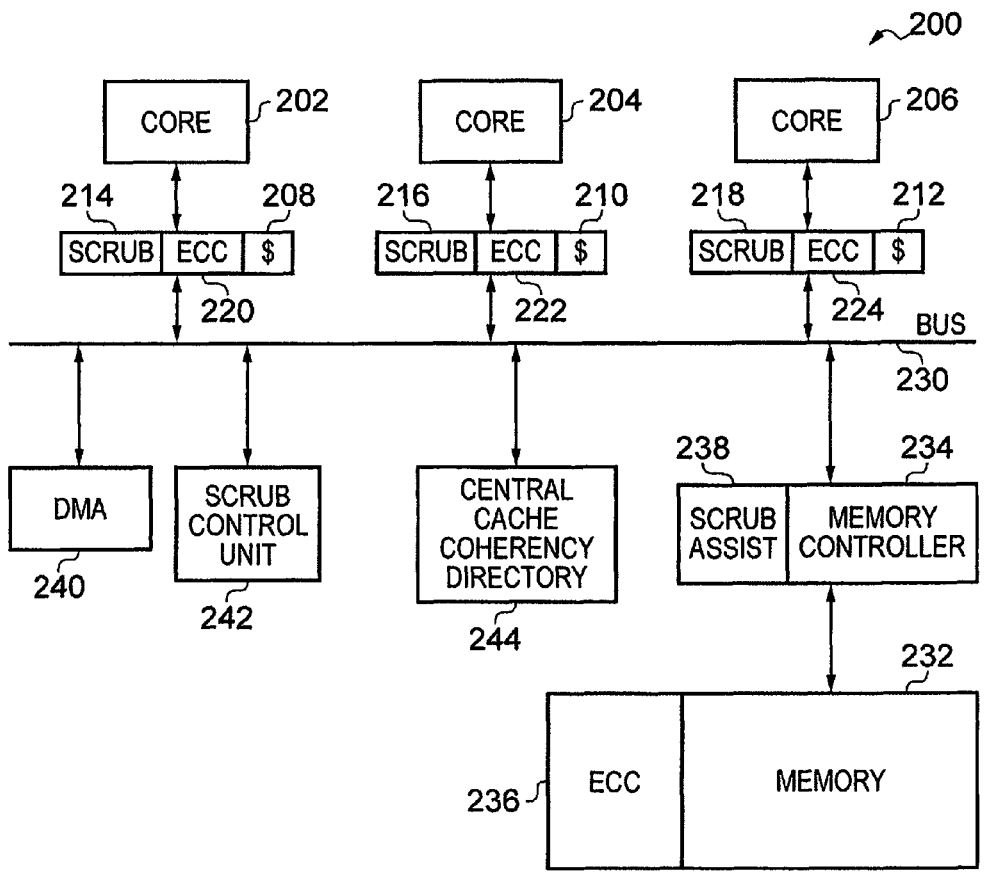
FIG. 3 schematically illustrates a multi-core data processing apparatus in one embodiment.

FIG. 3 presents another schematic view of another multi-core example embodiment. Here, the data processing apparatus 200 comprises three processor cores 202, 204, 206 each of which has an associated L1 cache 208, 210 and 212 respectively. The L1 caches 208, 210, 212 are arranged similarly to the L1 caches 106 and 108 in FIG. 2, each having a data scrubbing unit 214, 216, 218 and each cache storing associated ECC bits 220, 222, 224. Each processor core and its associated L1 cache are coupled to a system bus 230, allowing interaction between each of these components and the further components of the data processing apparatus.

The data processing apparatus 200 also comprises an external memory 232 to which access is administered by the memory controller 234. As described above, memory 232 has associated ECC data 236, and memory controller 234 has an associated data scrubbing unit (hardware scrub assist unit 238). Further, the data processing apparatus 200 comprises a DMA 240, a scrub control unit 242 and a central cache coherency directory 244, each of which are coupled to the system bus 230. Scrub transactions may be issued by any of the cores 202, 204, 206, but may also be issued by the DMA 240 which may be programmed to do so by one of the processor cores 202, 204, 206. As described above with reference to FIG. 2, the scrub control unit 242 is provided as a central administrator for the data scrubbing processes which take place within the processing apparatus. In particular, the arrangement illustrated in FIG. 3 highlights the fact that a central cache coherency directory 244 is provided, which enables the scrub control unit 242 to determine how a given scrub transaction should be handled. For example, for a scrub transaction issued by core 202 and first received by data scrub unit 214 with reference to L1 cache 208, the scrub control unit 242 can determine with reference to the central cache coherency directory 244 whether or not to cause that scrub transaction to be transferred to scrub unit 216, scrub unit 218 or scrub unit 238, depending on the status information stored in association with the relevant data values in the cache coherency directory 244. This will be described in more detail hereinafter.

Figure 4:
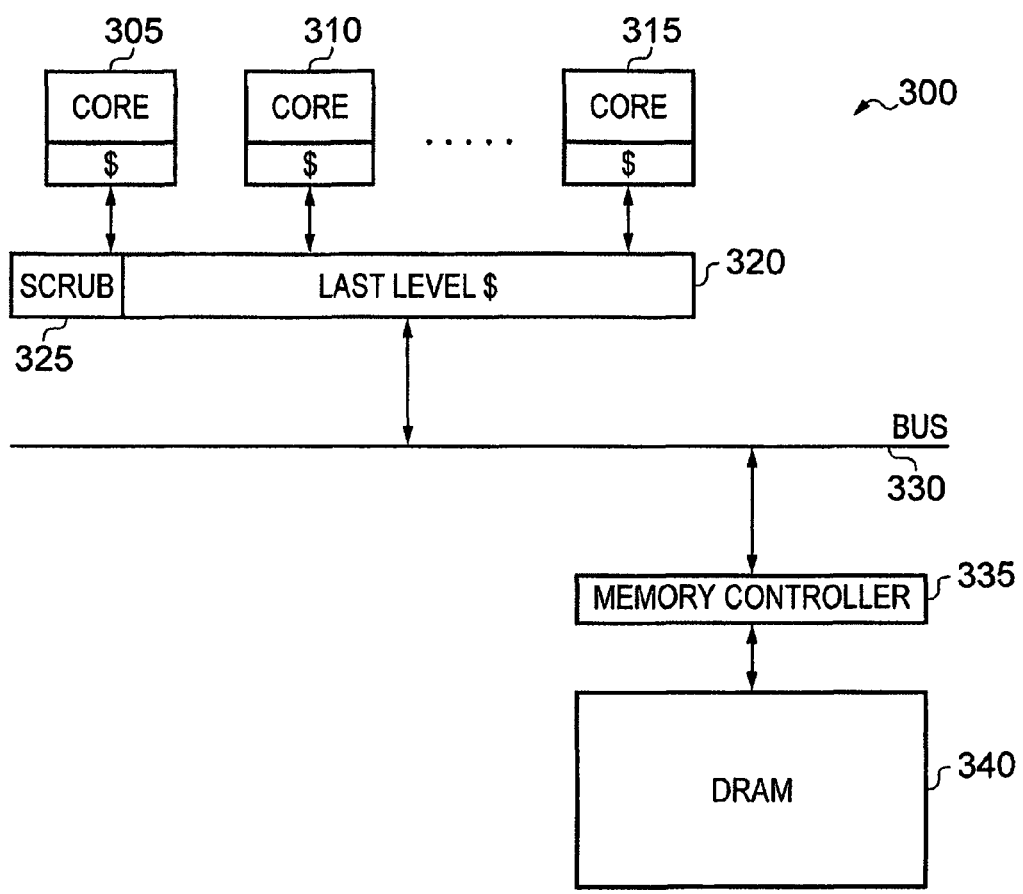
FIG. 4 schematically illustrates a multi-core data processing apparatus in one embodiment.

FIG. 4 schematically illustrates another example multi-core embodiment. This data processing apparatus 300 illustrates that many processor units may be present in a multi-core embodiment (wherein only three cores 305, 310 and 315 are illustrated here for clarity of illustration). Each core has an associated L1 cache and the set of processor cores shares a last level cache 320, which has an associated data scrub unit 325. The last level cache 320 connects via bus 330 to external DRAM 340 which is accessed by means of memory controller 335.

Figure 5:
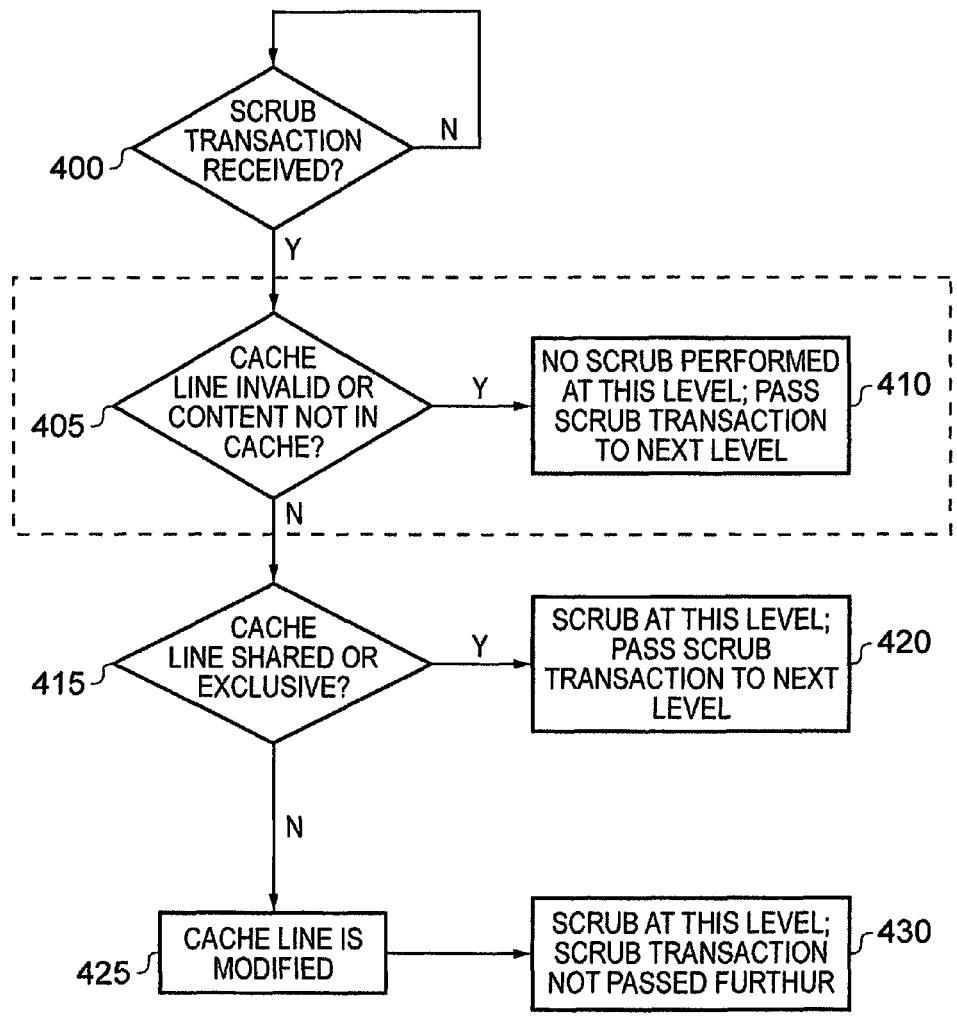
FIG. 5 schematically illustrates a series of steps taken in a data processing apparatus in one embodiment.

FIG. 5 schematically illustrates a series of steps which may be taken in an embodiment of a multi-core system which implements a snoop bus protocol (e.g. MESI or MOESI). The flow begins at step 400 where the process waits until a scrub transaction is received. At step 405 when a memory scrub transaction is issued by the core the L1 cache for that core is accessed. If the cache line is invalid or not present in the cache then the flow proceeds to step 410 where no data scrubbing is performed in the cache, no snoop broadcast is sent, and the scrub transaction is passed to the next level of the memory.

If however the cache line is present in the cache then it is determined at step 415 if this cache line is marked as shared or exclusive. If it is then the data scrub process is performed at this level and the scrub transaction is also passed to the next level of memory (step 420). As an alternative for the shared state, the other caches can be snooped for scrubbing purposes, but there will not be a cache transfer. Finally, if instead the cache line is marked as modified (step 425), the flow proceeds to step 430 where the scrub process is performed at this level, but the scrub transaction is not passed further since this cache line has the most recent copy.

Figure 6:
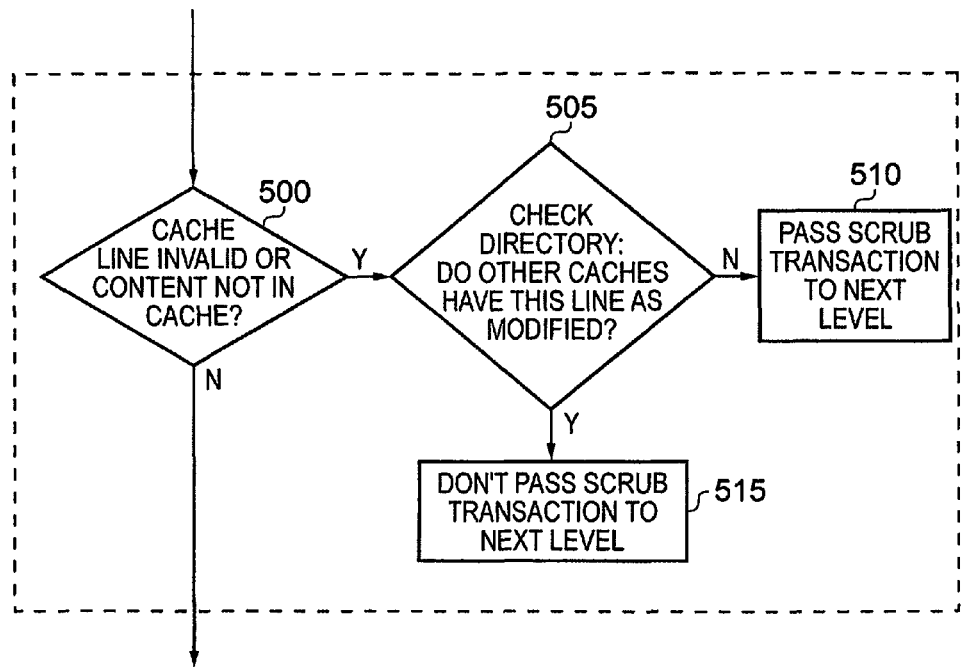
FIG. 6 schematically illustrates an alternative for some of the steps illustrated in FIG. 5.

FIG. 6 schematically illustrates an alternative way that steps 405 and 410 (FIG. 5) may be handled in a multi-core system which implements directory-based coherency control. In this situation, instead of step 405, step 500 is performed where it is also determined if the cache line is invalid or not in the cache of the issuing core. If this is true then the flow proceeds to step 505 where the directory is checked to determine if other caches have this line in the modified state. If no other cache has this line in the modified state, the flow proceeds to step 510 where the scrub transaction is passed to the next level of memory. However, if any other cache does have this line in the modified state then the flow proceeds to step 515, at which no further action is taken and the scrub transaction is not passed to the next level in memory. This due to the fact that the other cache has the most recent copy of this cache line.

A scrub transaction may be issued in a number of ways in the data processing apparatus. For example, in the embodiment illustrated in FIG. 3, the DMA 240 can be programmed by one of the processor cores to issue scrub transactions. For example, one of the processor cores can program a number of registers in the DMA, such as a base address register, a range register and a control register indicating an operation type (i.e. in this context indicating a scrub operation). A return type can also be programmed in this manner (i.e. flagging whether to return data to the processor or not). Once the registers are programmed by the processor like this, the DMA operation can be started. Alternatively, a scrub transaction may be issued by one of the processor units. In particular, the processor units can be configured to execute a scrub instruction, allowing the programmer control over the data scrubbing process.

FIG. 7 shows some example scrub instruction semantics. A scrub instruction may be issued without operands in which case the instruction is interpreted as meaning that the entire memory address space of the memory system should be scrubbed. Alternatively, the scrub instruction may specify a specific memory address which should be subjected to the data scrubbing process.

The scrub instruction may instead specify a memory address and a range, indicating that the specified memory range starting at that memory address should be subjected to the data scrubbing process. Also, the scrub instruction can have an additional "RET" flag as an operand indicating that the specified memory address(es) should be scrubbed and if an error is found at the specified memory address(es) then the uncorrected data value should be returned to the processor. This enables a level of visibility to the programmer in terms of knowing which areas of memory tend to generate errors. The provision of a scrub instruction can for example be useful to real-time system programmers where it can help to ensure predictability in the memory system. For example, the scrub instruction can be used to scrub certain portions of the memory that are known to be about to be used before a real time task executes. This provides a much more targeted approach to guaranteeing the predictability in memory rather than a periodic hardware memory scrubbing process that on the one hand can occupy the memory controller for undesirably long periods of time and on the other hand is not guaranteed to have scrubbed a particular memory area immediately before a real time task makes access to it.

Accordingly, a data processing apparatus is provided which comprises a processor unit configured to perform data processing operations in response to a sequence of instructions and a storage unit configured to store data values for access by the processor unit when performing its data processing operations. Redundant error control data is stored in association with the data values, the redundant error control data enabling identification of an error in the data values. The data processing apparatus also comprises a data scrubbing unit configured to perform a data scrubbing process on at least a subset of the data values, the data scrubbing process comprising determining with reference to the redundant error control data if an error is present in that subset of data values and, where possible, correcting that error with reference to the redundant error control data. The data scrubbing unit is configured to receive a scrub transaction issued within said data processing apparatus, and to perform the data scrubbing process upon receipt of the scrub transaction.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:

1. A data processing apparatus comprising:
    a processor core having a fetch unit, a decode unit, and an issue unit, said processor core configured to perform data processing operations in response to a sequence of program instructions including a data scrub program instruction;
    a storage unit configured to store data values for access by said processor core when performing said data processing operations, wherein redundant error control data is stored in association with said data values, said redundant error control data enabling identification of an error in said data values; and
    a data scrubbing unit configured to perform a data scrubbing process on at least a subset of said data values, said data scrubbing process comprising determining with reference to said redundant error control data if said error is present in said subset of data values and, where possible, correcting said error with reference to said redundant error control data,
    wherein said data scrubbing unit is configured to receive a scrub transaction issued within said processor core, and said data scrubbing unit is configured to perform said data scrubbing process upon receipt of said scrub transaction, and
    wherein said processor core is configured to issue said scrub transaction to said storage unit in response to said data scrub program instruction in said sequence of program instructions decoded by said decode unit of said processor core.

2. The data processing apparatus as claimed in claim 1, wherein said processor core is configured to program a further component of said data processing apparatus to issue said scrub transaction to said storage unit.

3. The data processing apparatus as claimed in claim 1, wherein said data processing apparatus comprises a memory hierarchy, said storage unit forming a level of said memory hierarchy, wherein said data processing apparatus is configured to pass said scrub transaction through sequential levels of said memory hierarchy.

4. The data processing apparatus as claimed in claim 3, wherein each of said sequential levels of said memory hierarchy has an associated data scrubbing unit and each associated data scrubbing unit is configured to perform said data scrubbing process at its respective level of said memory hierarchy in response to receipt of said scrub transaction.

5. The data processing apparatus as claimed in claim 3, wherein said data processing apparatus further comprises:
    a further processor core;
    a first local storage unit associated with said processor core, said first local storage unit configured to store first local copies of said data values for use by said processor core;
    a second local storage unit associated with said further processor core, said second local storage unit configured to store second local copies of said data values for use by said further processor core,
    wherein each of said first and second local storage units has a local data scrubbing unit configured to perform said data scrubbing process with respect to said first local copies and said second local copies respectively upon receipt of said scrub transaction.

6. The data processing apparatus as claimed in claim 5, wherein said data processing apparatus comprises a coherency controller, said coherency controller configured to administer a coherency protocol between said first local storage unit and said second local storage unit.

7. The data processing apparatus as claimed in claim 6, wherein said coherency controller comprises a snoop control unit.

8. The data processing apparatus as claimed in claim 6, wherein said coherency controller comprises a cache coherency directory.

9. The data processing apparatus as claimed in claim 6, wherein said data processing apparatus comprises a scrub control unit, said scrub control unit configured to control said data scrubbing process in dependence on said coherency protocol.

10. The data processing apparatus as claimed in claim 9, wherein said scrub control unit is configured, if said coherency protocol indicates that a local copy of a data value which is subject to said scrub transaction is invalid, to cause said data scrubbing process not to be performed with respect to said local copy and to cause said scrub transaction to be passed to a next level of said memory hierarchy.

11. The data processing apparatus as claimed in claim 9, wherein said scrub control unit is configured, if said coherency protocol indicates that a local copy of a data value which is subject to said scrub transaction is shared or exclusive, to cause said data scrubbing process to be performed with respect to said local copy and to cause said scrub transaction to be passed to a next level of said memory hierarchy.

12. The data processing apparatus as claimed in claim 9, wherein said scrub control unit is configured, if said coherency protocol indicates that a local copy of a data value which is subject to said scrub transaction is modified, to cause said data scrubbing process to be performed with respect to said local copy and to cause said scrub transaction not to be passed to a next level of said memory hierarchy.

13. The data processing apparatus as claimed in claim 9, wherein said coherency controller comprises a cache coherency directory and wherein said scrub control unit is configured, if said cache coherency directory indicates that corresponding to a local copy of a data value which is subject to said scrub transaction there is a further local copy stored in further local storage unit which is modified, to cause said data scrubbing process not to be performed with respect to said local copy and to cause said scrub transaction not to be passed to a next level of said memory hierarchy.

14. The data processing apparatus as claimed in claim 9, wherein said scrub control unit is configured to control said snoop control unit to cause said scrub transaction to be passed to said second storage unit when said scrub transaction is received by said first storage unit, and said scrub control unit is configured to control said snoop control unit to cause said scrub transaction to be passed to said first storage unit when said scrub transaction is received by said second storage unit.

15. The data processing apparatus as claimed in claim 1, wherein said data processing apparatus further comprises a memory controller configured to schedule access to said data storage unit, wherein said data scrubbing unit forms part of said memory controller.

16. The data processing apparatus as claimed in claim 15, wherein said memory controller is configured to receive said scrub transaction issued to said storage unit, and in response to schedule an access to said storage unit to retrieve said subset of data values to be subjected to said data scrubbing process by said data scrubbing unit.

17. The data processing apparatus as claimed in claim 16, wherein said access further comprises writing said subset of data values back to said storage unit after said data scrubbing process by said data scrubbing unit.

18. The data processing apparatus as claimed in claim 15, wherein said memory controller is configured to abandon said access to said data storage unit, if a higher priority memory access request is received.

19. The data processing apparatus as claimed in claim 1, wherein said data processing apparatus further comprises a cache controller configured to schedule access to said data storage unit, wherein said data scrubbing unit forms part of said cache controller.

20. The data processing apparatus as claimed in claim 19, wherein said cache controller is configured to receive said scrub transaction issued to said storage unit, and in response to schedule a cache access to said storage unit to retrieve said subset of data values to be subjected to said data scrubbing process by said data scrubbing unit.

21. The data processing apparatus as claimed in claim 20, wherein said cache access further comprises writing said subset of data values back to said storage unit after said data scrubbing process by said data scrubbing unit.

22. The data processing apparatus as claimed in claim 19, wherein said cache controller is configured to abandon said access to said data storage unit, if a higher priority cache access request is received.

23. The data processing apparatus as claimed in claim 1, wherein said data scrub transaction specifies at least one data address in said storage unit, said at least one data address identifying said subset of data values.

24. The data processing apparatus as claimed in claim 23, wherein said data scrub transaction further specifies a data address range, said at least one data address and said data address range identifying said subset of data values.

25. The data processing apparatus as claimed in claim 1, wherein said data scrub transaction further comprises a data return indicator, wherein said data processing apparatus is configured such that, if said error is present in said subset of data values, an error-containing data value in which said error is present is returned to said processor core.

26. The data processing apparatus as claimed in claim 1, wherein said data scrub transaction does not specify a data address in said storage unit, and said data scrubbing unit is configured to perform said data scrubbing process on all data values stored in said storage unit upon receipt of said scrub transaction.

27. The data processing apparatus as claimed in claim 1, wherein said data processing apparatus further comprises at least one further processor core configured to perform said data processing operations in response to said sequence of instructions.

28. The data processing apparatus as claimed in claim 1, wherein said data processing apparatus is configured to perform said data processing operations in a real-time data processing environment.

29. The data processing apparatus as claimed in claim 1, wherein said data processing apparatus is configured to perform said data processing operations in a server system.

30. The data processing apparatus as claimed in claim 1, wherein said data processing apparatus is configured to perform said data processing operations in a fault tolerant system.

31. The data processing apparatus as claimed in claim 1, wherein said subset of said data values comprises instruction data.

32. The data processing apparatus as claimed in claim 1, wherein said subset of said data values comprises data values which are non-instruction data.

33. The data processing apparatus as claimed in claim 1, wherein said processor core comprises a dedicated scrub issue unit configured to issue said scrub transaction to said storage unit.

34. The data processing apparatus as claimed in claim 1, wherein said processor core comprises a load/store unit configured to issue said scrub transaction to said storage unit.

35. A data processing apparatus comprising:
processing means for performing data processing operations in response to a sequence of program instructions including a data scrub program instruction, said processing means having a fetch unit, a decode unit, and an issue unit;
storage means for storing data values for access by said processing means when performing said data processing operations, wherein redundant error control data is stored in association with said data values, said redundant error control data enabling identification of an error in said data values; and
data scrubbing means for performing a data scrubbing process on at least a subset of said data values, said data scrubbing process comprising determining with reference to said redundant error control data if said error is present in said subset of data values and, where possible, correcting said error with reference to said redundant error control data,
wherein said data scrubbing means is configured to receive a scrub transaction issued within said processing means, and said data scrubbing means is configured to perform said data scrubbing process upon receipt of said scrub transaction, and
wherein said processing means is configured to issue said scrub transaction to said storage unit in response to said data scrub program instruction in said sequence of program instructions decoded by said decode unit of said processing means.

36. A method of data processing in a data processing apparatus comprising the steps of:

performing data processing operations in a processor core in response to a sequence of program instructions including a data scrub program instruction, said processor core having a fetch unit, a decode unit, and an issue unit;

storing data values in a storage unit for access when performing said data processing operations, wherein redundant error control data is stored in association with said data values, said redundant error control data enabling identification of an error in said data values; and performing a data scrubbing process on at least a subset of said data values, said data scrubbing process comprising determining with reference to said redundant error control data if said error is present in said subset of data values and, where possible, correcting said error with reference to said redundant error control data, wherein performing said data scrubbing process is carried out upon receipt of a scrub transaction issued within said processor core, and wherein said processor core issues said scrub transaction to said storage unit in response to said data scrub program instruction in said sequence of program instructions decoded by said decode unit of said processor core.

\* \* \* \* \*